(12) United States Patent
Kim et al.

(10) Patent No.: US 8,194,463 B2
(45) Date of Patent: Jun. 5, 2012

(54) FLASH MEMORY DEVICE AND PROGRAMMING METHOD THEREOF

(75) Inventors: Jong-Hwa Kim, Seoul (KR); Seok-Cheon Kwon, Yongin-si (KR); Young-Joon Choi, Seongnam-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 431 days.

(21) Appl. No.: 12/485,983

(22) Filed: Jun. 17, 2009

(65) Prior Publication Data

US 2010/0008149 A1 Jan. 14, 2010

(30) Foreign Application Priority Data

Jul. 9, 2008 (KR) .................................. 2008-66540

(51) Int. Cl.
*G11C 16/06* (2006.01)
*G11C 11/34* (2006.01)
(52) U.S. Cl. ............................... 365/185.22; 365/185.18
(58) Field of Classification Search ............. 365/185.22, 365/185.18, 185.03
See application file for complete search history.

(56) References Cited

U.S. PATENT DOCUMENTS

| 6,661,711 B2 * | 12/2003 | Pan et al. .................... 365/185.3 |
| 7,864,585 B2 * | 1/2011 | Tamada .................... 365/185.18 |
| 7,961,523 B2 * | 6/2011 | Lee et al. ................. 365/185.25 |

FOREIGN PATENT DOCUMENTS

| JP | 10-027487 | 1/1998 |
| KR | 2000-4721 | 1/2000 |
| KR | 2001-1529 | 1/2001 |

* cited by examiner

*Primary Examiner* — Anh Phung
(74) *Attorney, Agent, or Firm* — Stanzione & Kim, LLP

(57) ABSTRACT

A programming method of a flash memory device having memory cells, and a flash memory device to perform the method, including programming selected memory cells according to loaded data, sensing states of the programmed memory cells and firstly latching the sensed states, and determining whether a program-inhibited memory cell among the selected memory cells has been programmed, with reference to the loaded data and the latched states, before determining whether the selected memory cells have been properly programmed.

21 Claims, 11 Drawing Sheets

FLASH MEMORY DEVICE AND PROGRAMMING METHOD THEREOF

CROSS-REFERENCE TO RELATED APPLICATIONS

This U.S. non-provisional patent application claims the benefit under 35 U.S.C. §119(a) of Korean Patent Application No. 2008-66540, filed on Jul. 9, 2008, in the Korean Intellectual Property Office, the disclosure of which is incorporated herein by reference in its entirety.

BACKGROUND

1. Field of the Invention

The present general inventive concept disclosed herein relates to semiconductor memory devices, and more particularly, to a flash memory device and programming method thereof.

2. Description of the Related Art

Flash memory devices are generally programmed through program loops having data loading, programming, and verifying periods. Referring to FIG. 1, which illustrates a programming procedure of a flash memory device, data to be programmed (hereinafter referred to as 'program data') is loaded into the flash memory device (e.g., into a page buffer of the flash memory device) from an external device (e.g., memory controller) during the data loading period. The loaded data is programmed in selected memory cells during the programming period. During the verifying period, the flash memory device determines whether the selected memory cells have been programmed with the loaded data.

In the flash memory device, the memory cells are erased before the programming procedure. Typically, an erased state of a memory cell is defined as data '1'. Therefore, in such an instance, selected memory cells will be maintained in a same state as the erased state when they are to be programmed into data '1'. Determining that selected memory cells have been programmed into data '1' is accomplished by reading data bits from the selected memory cells and determining whether the read data bits are all conditioned in a program pass state (e.g., data '1'). For example, if data '0' is properly programmed into selected memory cells, as shown in FIG. 1, the loaded data '0' will be changed into data '1' during the verifying period. If data '1' is properly programmed into selected memory cells, as shown in FIG. 1, the data '1' will be maintained without change during the verifying period. If the read data bits are all detected as being properly programmed, and therefore reflected as data '1' during the verifying period, the programming operation is terminated as being status pass (or program pass).

According to the aforementioned mode for programming, as shown in FIG. 2, although memory cells to be program-inhibited are programmed into data '0', data bits read out from selected memory cells will be determined as being in program pass (i.e., data '1'). In other words, as shown in FIG. 2, if the selected memory cells to be program-inhibited are maintained on the erased state (CASE2) or if all selected memory cells are properly programmed (CASE1), the programming procedure will be terminated as being status pass. This means data is falsely stored in the memory cells. As a result, even though the programming operation is terminated as status pass, a read error can be caused therefrom.

SUMMARY

The present general inventive concept is directed to a flash memory device capable of improving the reliability and a programming method thereof.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a programming method of a flash memory device having memory cells, including programming selected memory cells according to loaded data, sensing states of the programmed memory cells and firstly latching the sensed states, and determining whether a program-inhibited memory cell among the selected memory cells has been programmed, with reference to the loaded data and the firstly latched states, before determining whether the selected memory cells have been properly programmed.

The foregoing and/or other aspects and utilities of the present general inventive concept may also be achieved by providing a flash memory device including a memory cell array having memory cells arranged in rows and columns, a reading/writing circuit configured to provisionally reserve data to be stored in the memory cell array and program selected ones of the memory cells of the memory cell array in accordance with the reserved data, and a control logic circuit configured to control the reading/writing circuit. The reading/writing circuit may sense states of the programmed memory cells and firstly latches the sensed states. The reading/writing circuit may output a first verification data indicating whether a program-inhibited memory cell among the selected memory cells has been programmed, with reference to the loaded data and the latched states, before determining whether the program-inhibited memory cell among the selected memory cells has been programmed.

According to the present general inventive concept, the flash memory device may be improved in reliability by determining whether memory cells to be program-inhibited have been properly programmed.

A further understanding of the nature and features of the present general inventive concept herein may be realized by reference to the remaining portions of the specification and the attached figures.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
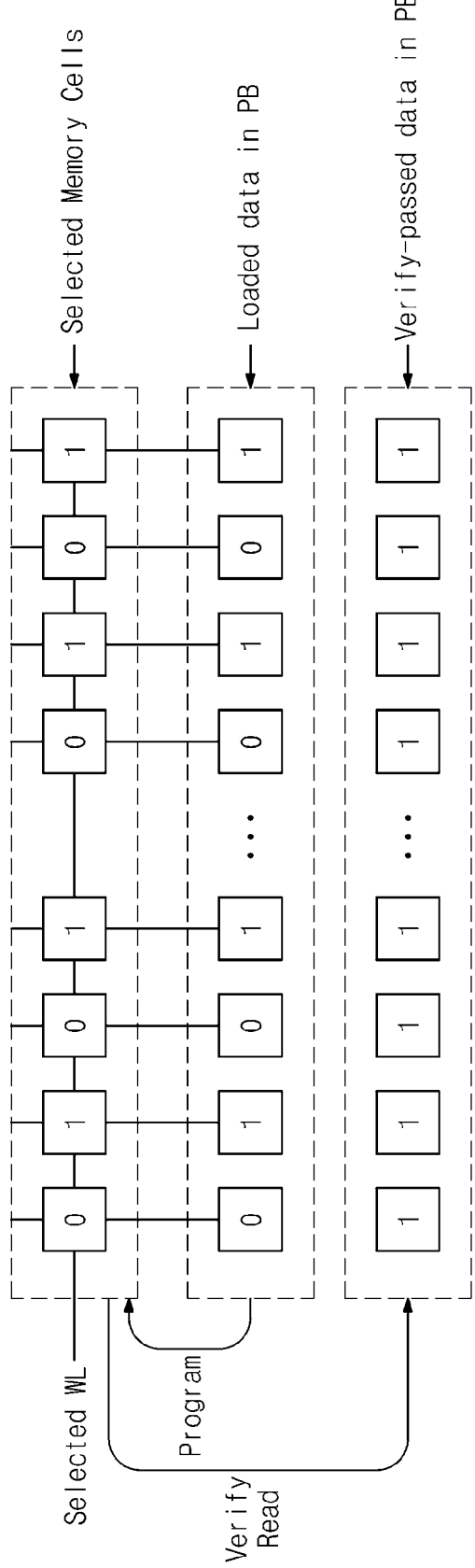
FIGS. 1 and 2 are diagrams illustrating a programming procedure of a flash memory device.
Figure 2:
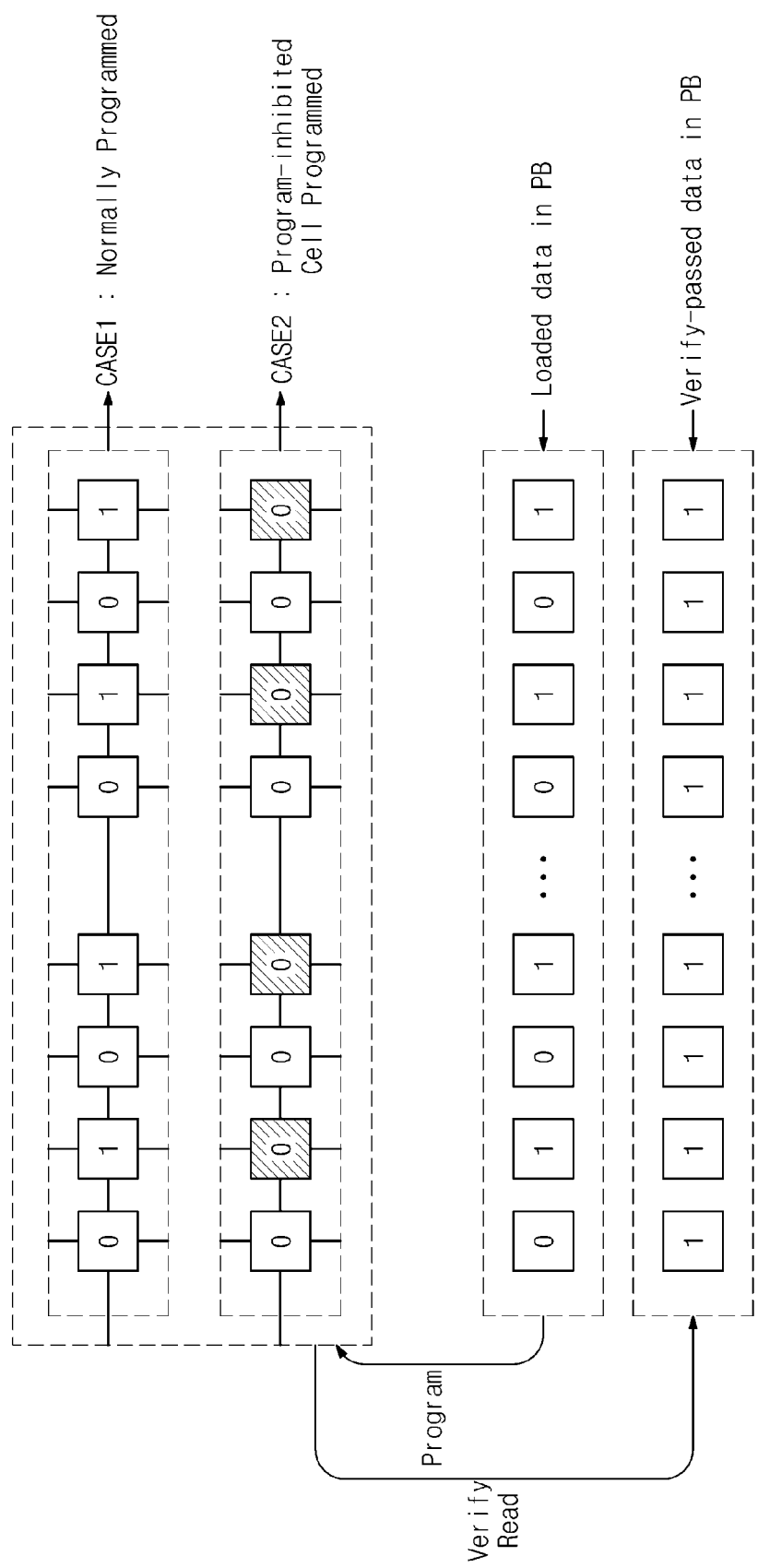

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

The present general inventive concept may, however, be embodied in different forms and should not be construed as being limited to the embodiments set forth herein. Rather, these embodiments are provided to explain different utilizations of the general inventive concept so that this disclosure will be thorough and complete, and will fully convey the scope of the present general inventive concept to those skilled in the art.

Figure 3:
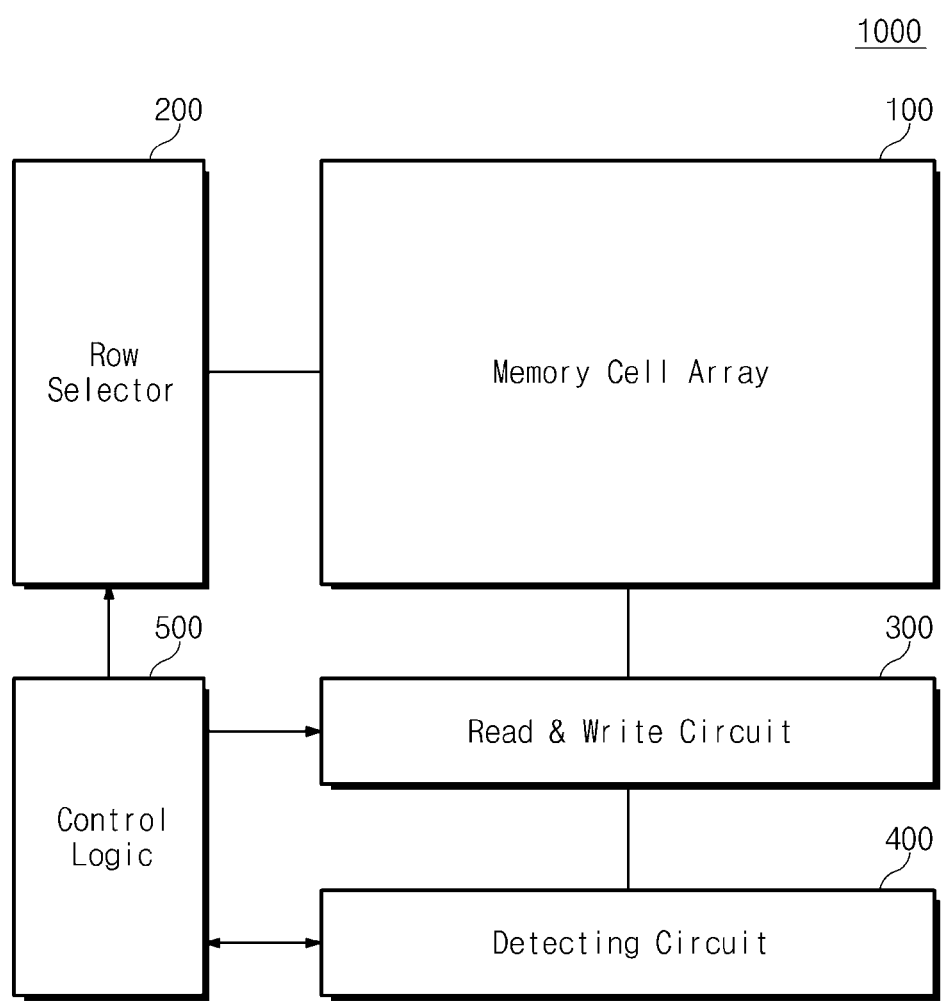
FIG. 3 is a block diagram illustrating a flash memory device according to an embodiment of the present general inventive concept.

FIG. 3 is a block diagram illustrating a flash memory device 1000 according to an embodiment of the present general inventive concept.

The flash memory device 1000 according to the present general inventive concept may be, for example, a NAND flash memory device. But the present general inventive concept should not be construed as being restricted to such a NAND flash memory. As illustrated in FIG. 3, the flash memory device 1000 according to the present general inventive concept may be comprised of a memory cell array 100, a row selector 200, a reading/writing circuit 300, a detection circuit 400, and a control logic circuit 500.

The memory cell array 100 includes pluralities of memory cells arranged on intersections of rows (e.g., word lines) and columns (e.g., bit lines). The memory cells may be arranged to form pluralities of NAND strings. Each memory cell may be configured to store single-bit or multi-bit data. Each memory cell may be formed in a unit having a charge storage layer or variable resistance. However, those ordinarily skilled in the art will understand that the present general inventive concept is not restricted hereto regarding a type of nonvolatile memory cell. The memory cell array 100 may be configured in a 2-dimensional (i.e., plane) or 3-dimensional (i.e., vertical) structure.

The row selector 200 may be controlled by the control logic circuit 500, and selects rows of the memory cell array 100. The reading/writing circuit 300 may be controlled by the control logic circuit 500, and may be configured to write/read data into/from the memory cell array 100. The detection circuit 400 may be controlled by the control logic circuit 500, and may determine whether program-inhibited memory cells have been programmed in accordance with data bits loaded into the reading/writing circuit 300 and data bits read through the reading/writing circuit 300. Further, the detection circuit 400 also may determine whether memory cells have been properly programmed in accordance with data bits read by way of the reading/writing circuit 300. This operation will be discussed in more detail later in this description.

Figure 4:
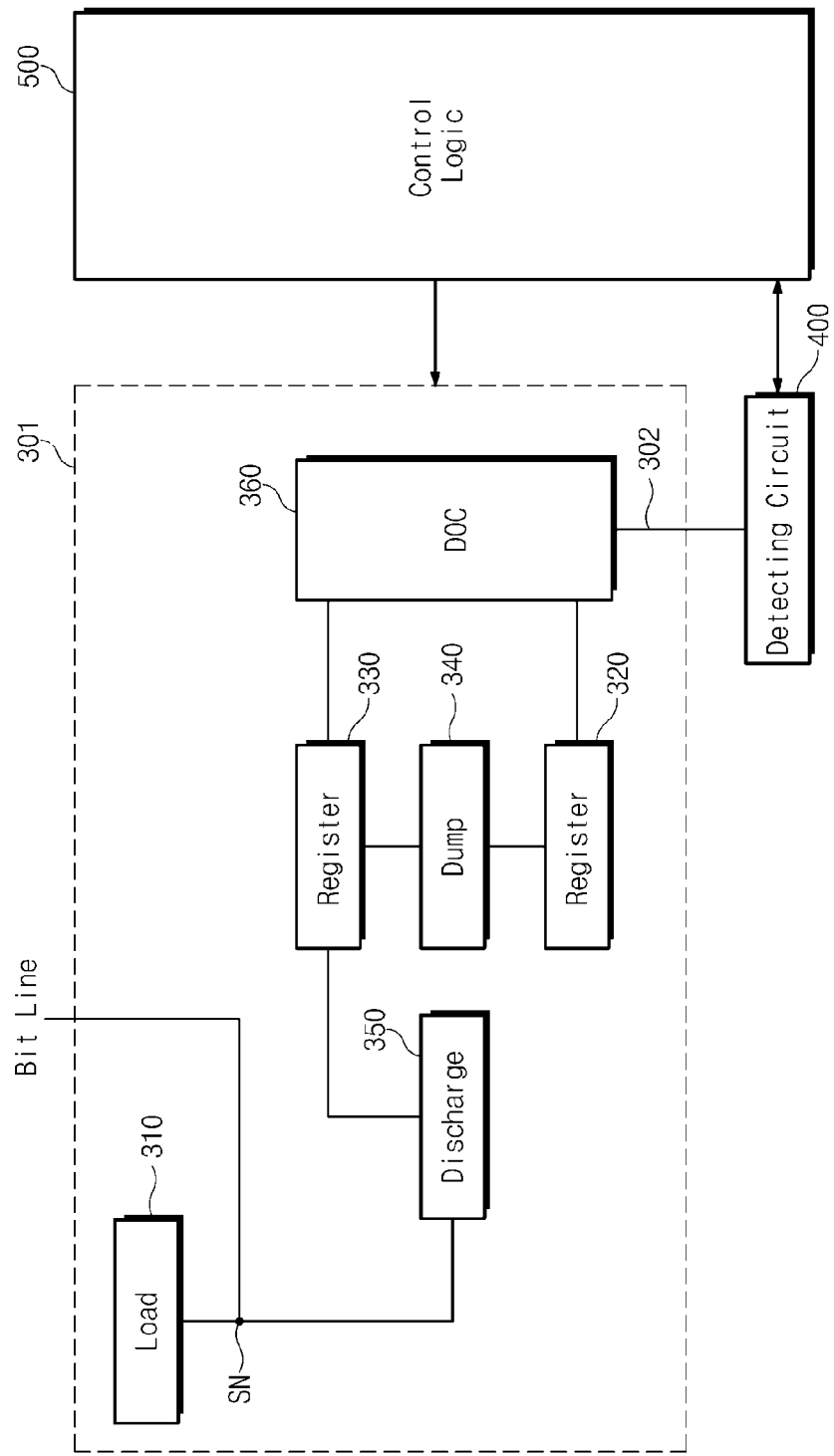
FIG. 4 is a block diagram illustrating a page buffer of the reading/writing circuit illustrated in FIG. 3 in accordance with an embodiment of the present general inventive concept.
Figure 5:
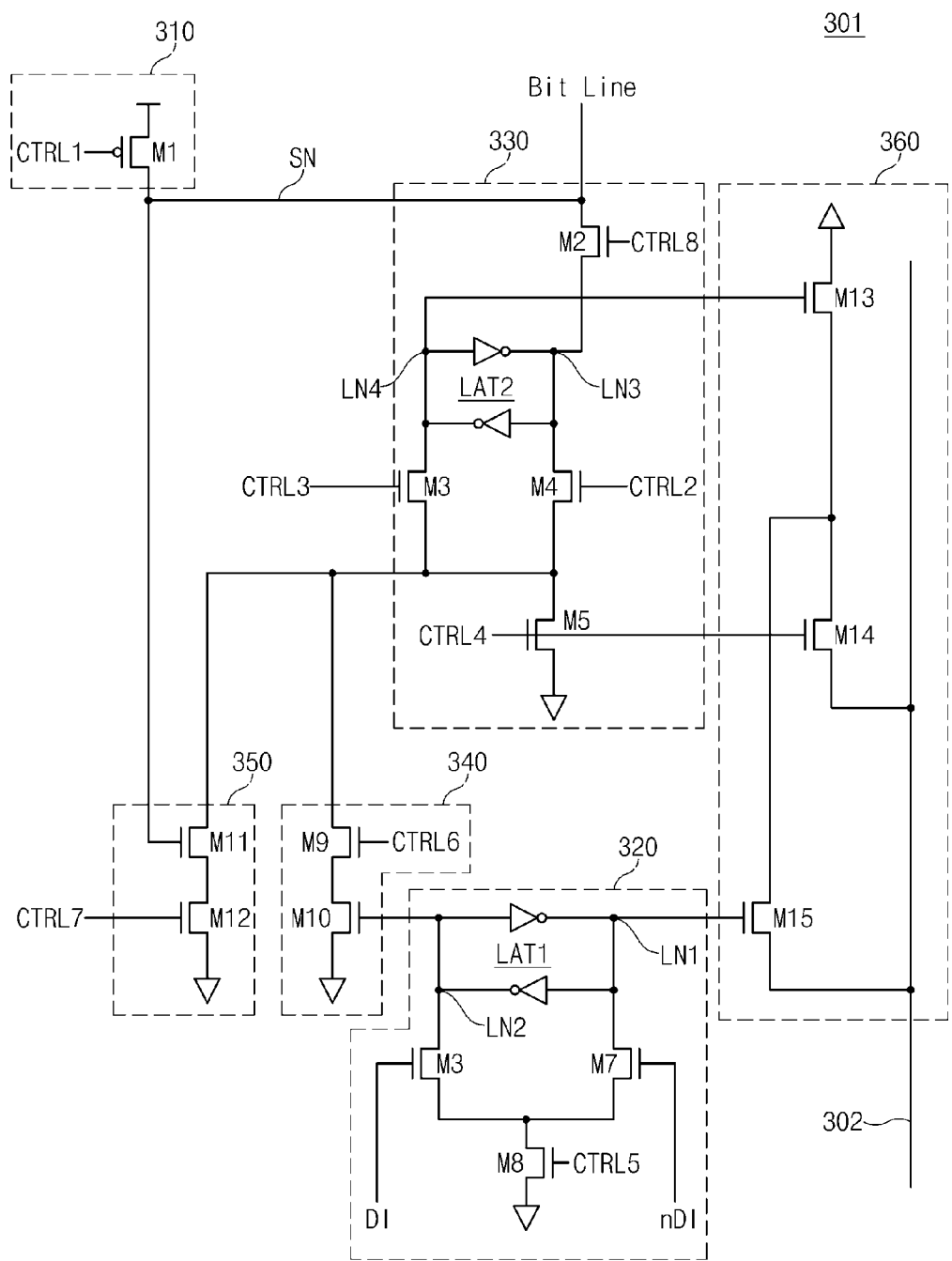
FIG. 5 illustrates a circuit diagram of the page buffer of FIG. 4 in accordance with an embodiment of the present general inventive concept.

FIG. 4 is a block diagram illustrating a portion of the reading/writing circuit 300 shown in FIG. 3 in accordance with an embodiment of the present general inventive concept, and FIG. 5 illustrates a circuit diagram of a page buffer 301 of FIG. 4 in accordance with an embodiment of the present general inventive concept. For convenience of description, FIG. 4 illustrates the page buffer 301 of the reading/writing circuit 300 in correspondence with a single bit line.

Referring to FIG. 4, the page buffer 301 may include a load 310, first and second registers 320 and 330, a dump 340, a discharge circuit 350, and a data output circuit (DOC) 360, operating in response to control by the control logic circuit 500. The load 310 may be connected to a sensing node SN, supplying a sensing current to a bit line. The first register 320 may be configured to provisionally store data to be programmed. Data held in the first register 320 may be transferred to the second register 330 through the dump 340. The discharge circuit 350 may operate to change data, which is stored in the second register 330, in accordance with a voltage of the sensing node SN. The data output circuit 360 may output data from the second register 330 to a data line 302, during a verifying operation, or may output a combination of data from the first and second registers 320 and 330 to the data line 302.

The load 310, the first and second registers 320 and 330, the dump 340, the discharge circuit 350, and the data output circuit 360 can be configured as shown in FIG. 5. But the page buffer 301 is not limited to the features illustrated in FIG. 4 or FIG. 5 in organization. An operation of the page buffer 301 illustrated in FIG. 5 will be discussed in more detail later in this description.

Figure 6:
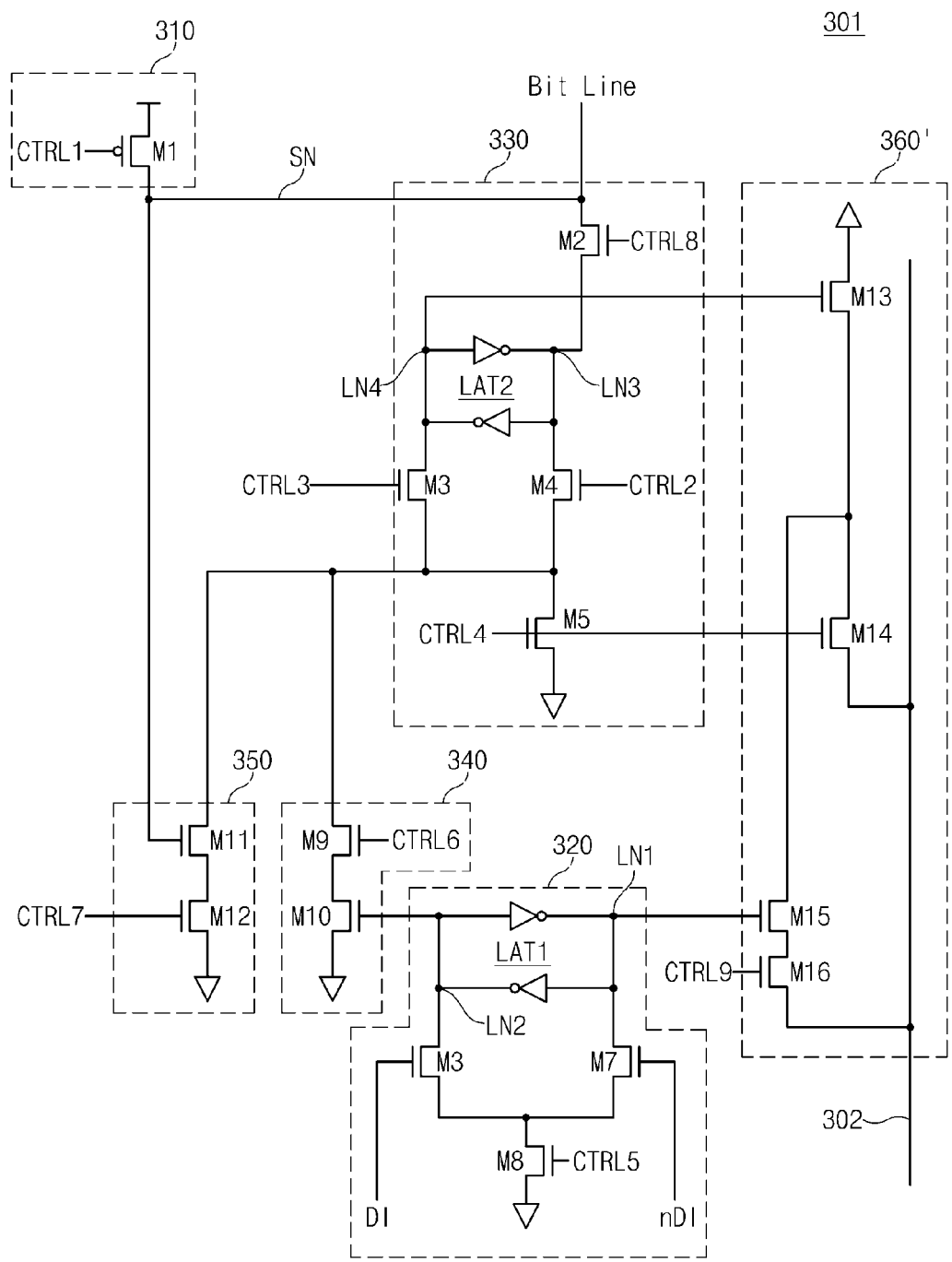
FIG. 6 illustrates a circuit diagram of the page buffer of FIG. 4 in accordance with another embodiment of the present general inventive concept.

According to another embodiment of the present general inventive concept, as illustrated in FIG. 6, a data output circuit 360' may further include an NMOS transistor M16. In this case, the NMOS transistor M16 may be activated after precharging the data line 302, in order to provide a uniform capacitive load while precharging the data line 302.

Figure 7:
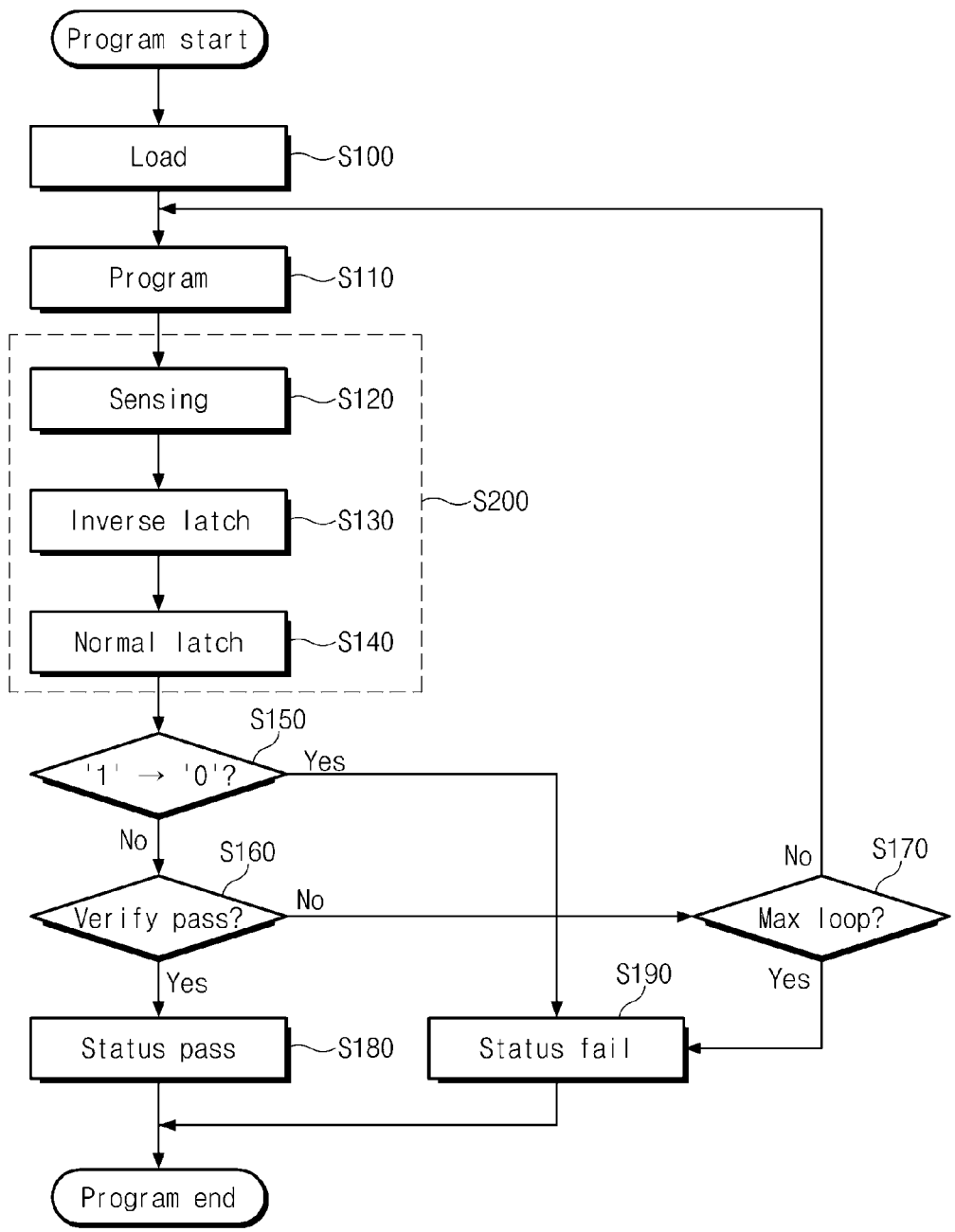
FIG. 7 is a flow chart illustrating a programming method of the flash memory device in accordance with an embodiment of the present general inventive concept.
Figure 8:
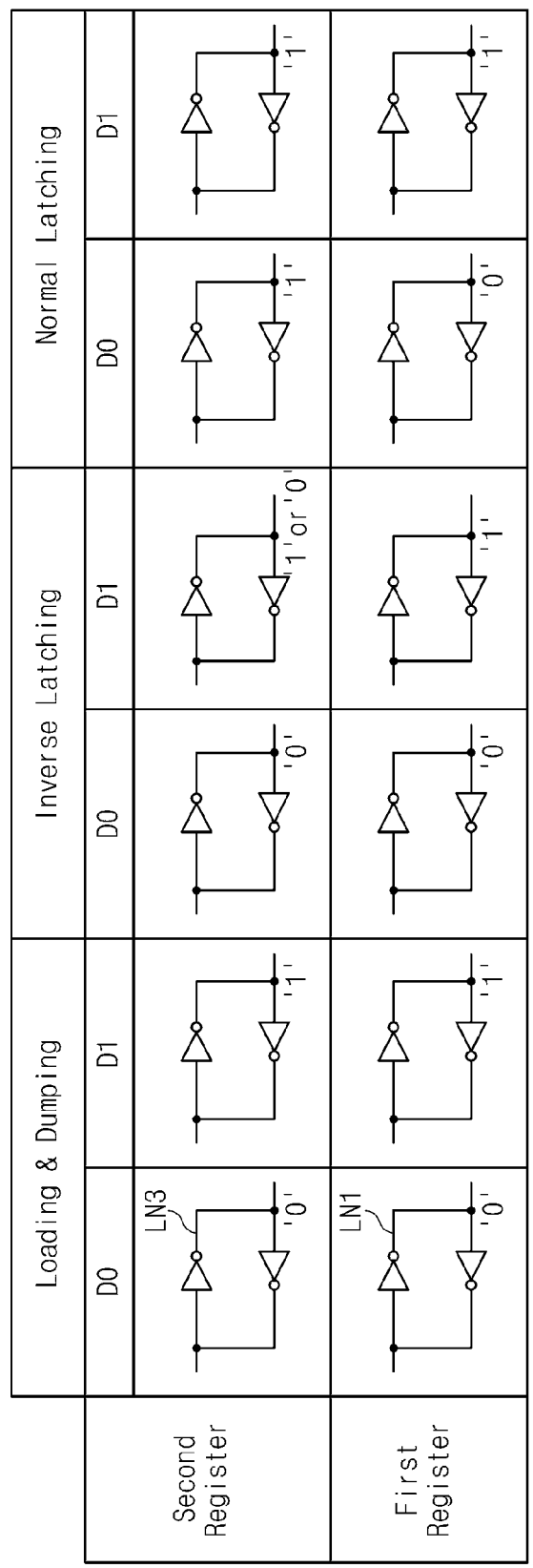
FIG. 8 is a diagram illustrating state variations of the registers during the programming operation by the present general inventive concept.

FIG. 7 is a flow chart illustrating a programming method of the flash memory device in accordance with an embodiment of the present general inventive concept, and FIG. 8 is a diagram illustrating state variations of the registers during the programming operation by the present general inventive concept. The programming method according to this embodiment will now be described in more detail in conjunction with FIGS. 5 through 8. The description will discuss a programming operation that will be carried out through a single program loop. The described operations S110~S170 are included in this single program loop. The flash memory device according to the present general inventive concept utilizes an incremental step-pulse programming (ISPP) scheme by which a program voltage increases by a predetermined increment every repetition of the program loop.

Before discussing various components of FIGS. 5-6 and 8 along with the flow chart of FIG. 7, the operations of the flow chart will be described with reference to FIG. 7 only. The program data may be loaded into the reading/writing circuit 300 in operation S100. The loaded program data may be programmed into selected memory cells in the memory cell array 100 in operation S110. After this programming operation, a verify-reading operation may be performed to determine whether selected memory cells have been successfully programmed in operation S200. The verify-reading operation S200 may include a sensing period (S120), an inverse latching period (S130), and a normal latching period (S140). Afterward, it may be determined whether a program-inhibited memory cell has been inadvertently programmed in operation S150. If it is determined in operation S150 that a program-inhibited memory cell has been mistakenly programmed, the programming operation is designated as a status fail and the programming procedure is ended in operation S190. If it is determined in operation S150 that a program-inhibited memory cell has not been detected as being inadvertently programmed, it may be determined whether a selected memory cell has been properly programmed in operation S160. If it is determined that the selected memory cell has been properly programmed in operation S160, the control logic circuit 500 arranges a result of the programming operation to status pass and terminates the programming procedure in operation S180. If it is not determined that the selected memory cell has been properly programmed in operation S160, it is determined whether a current count of the program loop has reached the maximum loop count in operation S170. If the current count of the program loop is determined to have reached the maximum, the programming operation is designated as a status fail and the programming procedure is ended in operation S190. If the current count of the program loop has not reached the maximum, the procedure returns to operation S110. These operations will now be described in greater detail, including a discussion of some of the components which may be involved in the operations.

At the beginning of the programming procedure, a latch node LN3 of the second register 330 may be first initiated to be high level. Thereafter, program data (i.e., data to be programmed) may be loaded into the reading/writing circuit 300 (S100). For instance, if a value of program data is '1', data input signals DI and nDI are input from the control logic 500 with high and low levels respectively and a control signal CTRL5 goes to high level. Then, a latch node LN1 of the first register 320 is set on high level (i.e., logical '1'). Conversely, if the value of program data is '0', data signals DI and nDI are input with low and high levels respectively and the control signal CTRL5 goes to low level. In this case, the latch node LN1 of the first register 320 is set on low level (i.e., logical '0'). Data loaded into the first register 320 is transferred to the second register 330 through the dump 340. To perform this transfer of the loaded data, control signals CTRL2 and CTRL6 are activated to high levels. If the latch node LN1 of the first register 320 is set to high level, an NMOS transistor M10 of the dump 340 is turned off. During this operation, although the control signals CTRL2 and CTRL6 are activated to high levels, a latch node LN3 is maintained on high level. Conversely, if the latch node LN1 of the first register 320 is set to low level, an NMOS transistor M10 of the dump 340 is turned on. During this operation, when the control signals CTRL2 and CTRL6 are activated to high levels, a latch node LN3 is changed from high level to low level. Through this described process, data loaded in the first register 320 is dumped into the second register 330. FIG. 8 illustrates logical states of the latch nodes LN1 and LN3 of the registers 320 and 330 by the data loading and dumping procedure. Specifically, if the value of the program data is logical '0', both LN1 and LN3 are set to low level after the data loading and dumping procedure, and if the value of the program data is logical '1', both LN1 and LN3 are set to high level after the data loading and dumping procedure.

Next, data held in the second register 330 may be programmed into selected memory cells (S110). When the data stored in the second register 330, i.e., the level set in the latch node LN3, is set on low level (i.e., logical '0'), selected memory cells may be programmed by a well-known mechanism (e.g., self-boosting). A physical mechanism of programming memory cells is well known by those skilled in the art, so will not be further described.

After completing the programming operation, a verify-reading operation may be conducted to determine whether the selected memory cells have been successfully programmed (S200). According to the flash memory device 1000 of the present general inventive concept, the verify-reading operation may be carried out by including a sensing period (S120), an inverse latching period (S130), and a normal latching period (S140). The verify-reading operation S200 will now be described in more detail.

During the sensing period (S120), according to whether a selected memory cell has been successfully programmed, its corresponding bit line, i.e., the sensing node SN, is set on high or low level. For instance, if the value of the program data is '0' and a selected memory cell has been properly programmed to have a desired threshold voltage, its corresponding bit line, i.e., the sensing node SN, is set on high level during the sensing period (S120). Meanwhile, if the value of the program data is '0' and a selected memory cell has not been programmed in the desired threshold voltage, the corresponding bit line, i.e., the sensing node SN, is set on low level during the sensing period (S120). Otherwise, if the value of the program data is '1', the corresponding bit line, i.e., the sensing node SN, is set to low level. Although the value of the program data is '1', a selected memory cell can still be programmed. In this case, the bit line, i.e., the sensing node SN, is set to high level.

The sensing node SN is set on high level, regardless of loaded data (i.e., logical '1' or '0'), when a selected memory cell thereof is programmed to have the desired threshold voltage. But the sensing node SN is set on low level in response to a selected memory cell thereof corresponding to data '0' having not been programmed in a desired threshold voltage or in response to the selected memory cell being a program-inhibited memory cell.

During the inverse latching period (S130), the control signals CTRL2 and CTRL7 are activated to high levels. Responding to the high-leveled activation of the control signals CTRL2 and CTRL7, a logical condition of the latch node LN3 is dependent on a voltage of the sensing node SN. For example, if the value of the program data is '0' and the sensing node SN is set on high level (i.e., if the selected memory cell has been properly programmed), the latch node LN3 is maintained on low level, i.e., logical '0'. If the value of the program data is '0' and the sensing node SN is set on low level (i.e., if the selected memory cell has a threshold voltage lower than a desired level, and has therefore not been properly programmed), the latch node LN3 is maintained on low level, i.e., logical '0'. That is, if the value of the program data is '0', the latch node LN3 is maintained in the previous state during the inverse latching period. If the value of the program data is '1' and the sensing node SN is set on low level (i.e., if a selected memory cell has been properly program-inhibited), the latch node LN3 is maintained on logical '1'. If the value of the program data is '1' and the sensing node SN is set on high level (i.e., if a program-inhibited memory cell has been programmed), the latch node LN3 changes from '1' to '0'. In other words, only if the value of the program data is '1' and the sensing node SN is set on high level, the latch node LN3 changes from '1' to '0'. Accordingly, as the latch node LN3 is set to '1' or '0', the data line 302 maintains its precharged level, i.e., high level, through the data output circuit 360, or changes into low level. Logical conditions of the latch nodes LN1 and LN3 varying during the inverse latching period are illustrated in FIG. 8.

If the latch node LN1 of the first register 320 is set on low level (i.e., a selected memory cell is a memory cell to be programmed, which is hereinafter referred to as 'program memory cell'), the data line 302 is maintained at the precharged level regardless of a logical condition of the latch node LN3 of the second register 330. Conversely, if the latch node LN1 of the first register 320 is set to high level (i.e., a selected memory cell is a memory cell to be program-inhibited), the data line 302 selectively changes dependent on a logical condition of the latch node LN3 of the second register 330. If the latch node LN1 of the first register 320 is set on high level while the latch node LN3 of the second register 330 is set on low level, NMOS transistors M13 and M15 of the data output circuit 360 are turned on to change the data line 302 from high to low level. This indicates that a program-inhibited memory cell has been inadvertently programmed.

As can be seen from the description above, when a memory cell corresponding to data '1' is programmed into data '0', the data line 302 changes during the inverse latching period. A voltage change of the data line 302 is determined by the detection circuit 400. A result of the detection is output to the control logic circuit 500.

Thereafter, during the normal latching period (S140), the control signals CTRL3 and CTRL7 are activated to high levels. If the control signals CTRL3 and CTRL7 are activated to high levels, a logical condition of the latch node LN3 changes according to a voltage of the sensing node SN. For instance, since the sensing node SN is set to high level if a selected memory cell is programmed in a desired threshold voltage or if a program-inhibited memory cell is programmed, the latch node LN3 changes from '0' to '1'. Otherwise, since the sensing node SN is set to low level if a selected memory cell is not programmed in the desired threshold voltage, the latch node LN3 is maintained on '0'. And, since the sensing node SN is set to low level if a selected memory cell is a program-inhibited memory cell, the latch node LN3 is maintained on '1'. Logical conditions of the latch nodes LN1 and LN3 varying during the normal latching period are shown in FIG. 8.

Afterward, the control logic circuit 500 may determine whether a program-inhibited memory cell has been inadvertently programmed (S150). This determination may be carried out according to a result from the detection circuit 400, i.e., a voltage variation of the data line 302. As previously described, if a program-inhibited memory cell is inadvertently programmed, the data line 302 changes to low level from high level. Thus, as a result of detecting a low level from the data line 302, it is determined that the program-inhibited memory cell has been accidentally programmed. In this case, the procedure goes to operation S190. In the operation S190, the control logic circuit 500 arranges a result of this programming operation to status fail and ends the programming procedure.

In response to a program-inhibited memory cell not being detected as being programmed, the procedure turns to operation S160. In operation S160, the control logic circuit 500 determines whether a selected memory cell to be programmed, i.e., a program memory cell, has been properly programmed. If the selected program memory cell is programmed successfully, the latch node LN3 changes from '0' to '1'. During this operation, the data line 302 is maintained on its precharging condition. This circumstance is determined as a verification pass by the control logic circuit 500. Conversely, if the program memory cell is still not programmed, the latch node LN3 is maintained at '0'. During this operation, the data line 302 is set to low level through the NMOS transistors M13 and M14 of the data output circuit 360. This change is determined as a verification fail by the control logic circuit 500.

If a verification pass is determined in operation S160, the procedure turns to S180. In the operation S180, the control logic circuit 500 arranges a result of the programming operation to status pass and terminates the programming procedure. If a verification fail is determined from the operation S160, the procedure goes to operation S170. In operation S170, the control logic circuit 500 determines whether a current count of the program loop has reached the maximum loop count. If the current count of the program loop is determined having reached the maximum, the procedure goes to operation S190. If the current count of the program loop is not determined to have reached the maximum, the procedure returns to operation S110. The other operations subsequent to operation S110 are the same as the aforementioned, and will therefore not be further described.

According to the programming method of the flash memory device by the present general inventive concept, it is possible to determine or detect whether a program-inhibited memory cell has been programmed as data '0'. Additionally, insignificant repetition of the program loop when there is detected a program-inhibited memory cell programmed in data '0' is prevented, reducing consumptive operations in the flash memory device.

In another exemplary embodiment, it is permissible to variously modify a point of detecting a voltage change from the data line 302 affected by data latched in the page buffer 301 during the inverse latch period. For instance, such detection may precede the normal latch period.

In yet another exemplary embodiment, the normal latch operation may be selectively conducted in accordance with a result of detecting a voltage variation from the data line 302. For instance, the normal latching operation can be carried out after determining whether the detected result of voltage variation from the data line 302 indicates that a program-inhibited memory cell has been inadvertently programmed. In other words, in the flow chart illustrated in FIG. 7, it is permissible to execute operation S150 prior to operation S140.

In still another exemplary embodiment, a data state latched during the inverse latch period may be complementary to a data state latched during the normal latch period for a program memory cell.

In another exemplary embodiment, the detection circuit 400 may be implemented by means of a pass/fail checking circuit ordinarily known in the art. Moreover, the detection circuit 400 may be included in the control logic circuit 500.

Figure 9:
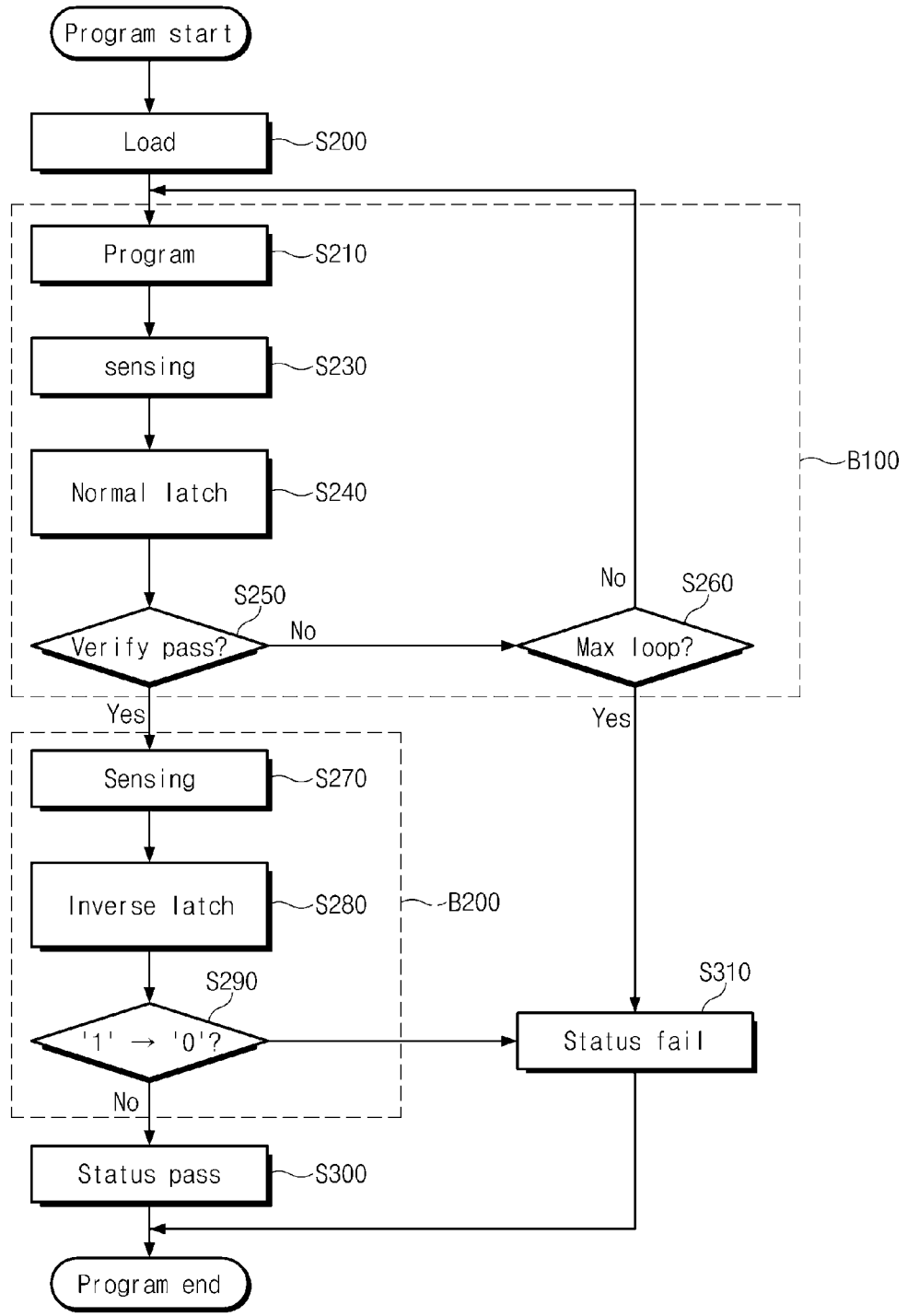
FIG. 9 is a flow chart illustrating a programming method of the flash memory device in accordance with another embodiment of the present general inventive concept.

FIG. 9 is a flow chart illustrating a programming method for the flash memory device 1000 in accordance with another embodiment of the present invention.

Referring to FIG. 9, a block B100 indicated by a broken line includes operations S210, S230, S240, S250, and S260 corresponding respectively to operations S110, S120, S140, S160, and S170 of FIG. 7. A block B200 indicated by a broken line includes operations S270, S280, and S290 corresponding respectively to operations S120, S130, and S150 of FIG. 7. According to the programming procedure illustrated in FIG. 9, whether a program-inhibited memory cell has been programmed (B200) is determined after a normal verify-reading operation. The operations shown in FIG. 9 may be similar to those shown in FIG. 7, so will not be further described.

Figure 10:
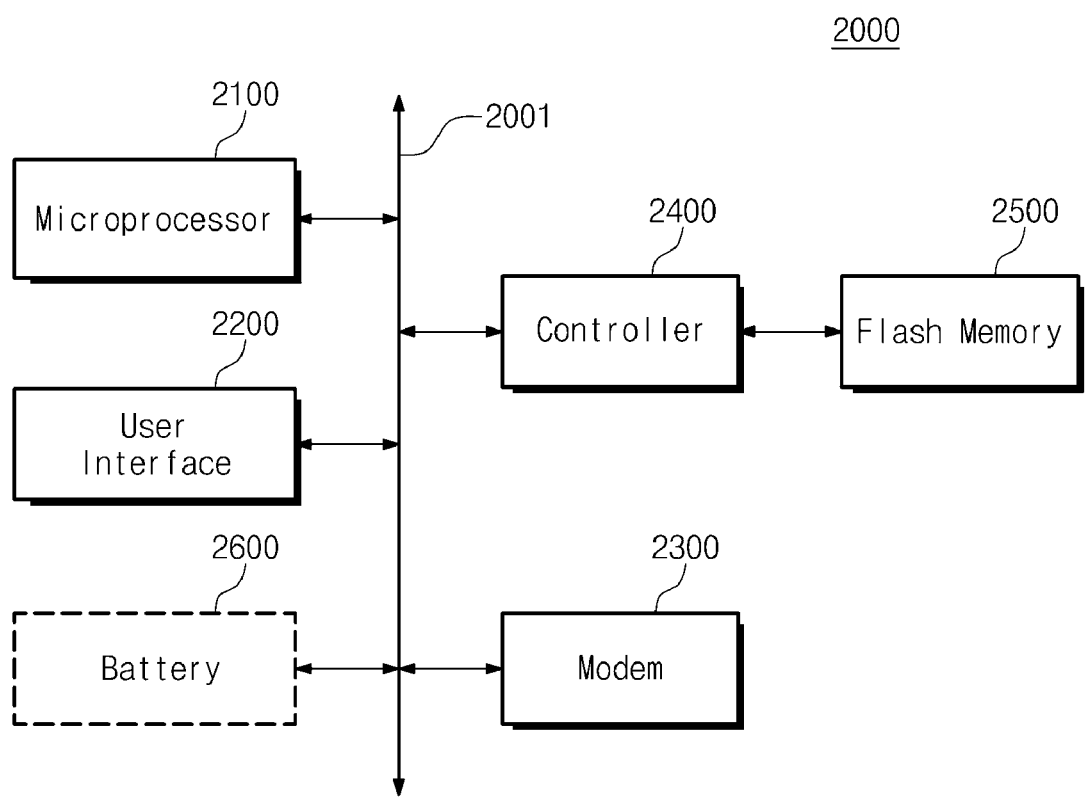
FIG. 10 is a block diagram illustrating a computing system with the flash memory device according to the present general inventive concept.

Flash memory devices are types of nonvolatile memories capable of keeping data stored therein even without power supply. With a rapid increase in the use of mobile apparatuses such as cellular phones, personal digital assistants (PDA), digital cameras, portable gaming consoles, and MP3 devices, the flash memory devices are widely employed as code storage, as well as data storage. The flash memory devices may be also utilized in home applications such as high-definition televisions (HDTV), digital versatile disks (DVD), routers, and global positioning systems (GPS). A schematic structure of a computing system including the flash memory device of the present general inventive concept is illustrated in FIG. 10. The computing system 2000 according to the present general inventive concept may be organized by including a microprocessor (CPU) 2100, a user interface 2200, a modem 2300 such as a baseband chipset, a memory controller 2400, and the flash memory device 2500, all of which are connected to each other by way of a bus 2001. The flash memory device 2500 may be configured substantially as same as that illustrated in FIG. 1. In the flash memory device 2500, N-bit data (N is a positive integer) processed or to be processed by the microprocessor 2100 may be stored through the memory controller 2400. If the computing system 2000 shown in FIG. 10 is a kind of mobile apparatus, it may be further include a battery 2600 for supplying power thereto. Although not illustrated in FIG. 10, the computing system 2000 may be further equipped with an application chipset, a camera image processor (e.g., complementary metal-oxide-semiconductor (CMOS) image sensor; i.e., CIS), a mobile DRAM, etc. The memory controller 2400 and the flash memory device 2500, for example, are able to constitute a solid state drive/disk (SSD) using a nonvolatile memory for storing data. An exemplary SSD is disclosed in U.S. Patent Publication No. 2006-0152981, which is incorporated herein by reference. The memory controller 2400 and the flash memory device 2500 may also form a memory card using a nonvolatile memory to store data.

Figure 11:
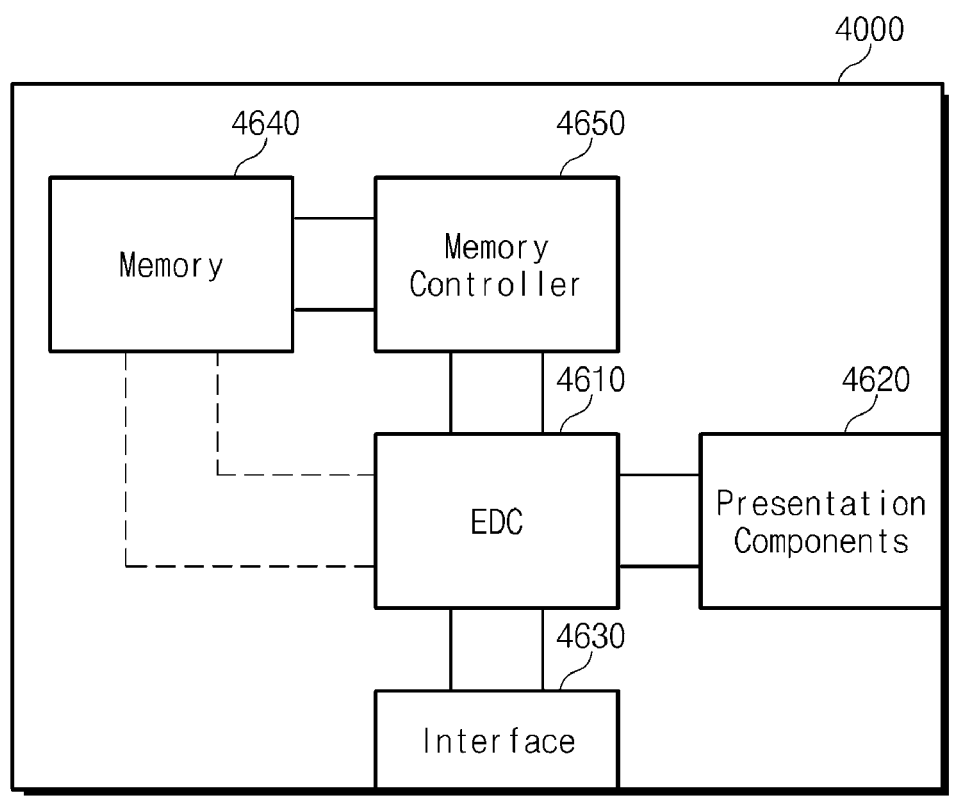
FIG. 11 is a block diagram illustrating a memory system according to an embodiment of the present invention.

FIG. 11 is a block diagram illustrating a memory system according to an embodiment of the present invention.

The memory system illustrated in FIG. 11 may be a portable apparatus 4000. The portable apparatus 4000 may be an MP3 player, a video player, a combination video and audio player, etc. As illustrated in FIG. 11, the portable apparatus 4000 includes a memory 4640 and a memory controller 4650. The memory 4640 and the memory controller 4650 may be similar to those illustrated FIG. 10, and therefore a detailed description thereof will be omitted. The portable apparatus 4000 may further include an encoder and decoder 4610, presentation components 4620, and an interface 4630.

Data (video, audio, etc.) processed by the encoder and decoder (EDC) 4610 can be input to the memory 4640, through the memory controller 4650, and output from the memory 4640. As illustrated by dotted lines in FIG. 11, data can also be input directly into the memory 4640 from the EDC 4610 and/or output directly into the EDC 4610 from the memory 4640.

The EDC 4610 is able to encode data in order to store the data into the memory 4640. For instance, the EDC 4610 may be able to conduct an MP3 encoding operation with audio data in order to store the data in the memory 4640. In another way, the EDC 4610 may be able to conduct an MPEG encoding operation (e.g., MPEG2, MPEG4, etc.) with video data in order to store the data in the memory 4640. Further, the EDC 4610 may include pluralities of encoders to encode data of other types in accordance with other data formats. For example, the EDC 4610 may include an MP3 encoder for audio data and an MPEG encoder for video data.

The EDC 4610 is also able to decode an output of the memory 4640. For instance, the EDC 4610 may be able to conduct an MP3 decoding operation with audio data output from the memory 4640. In another way, the EDC 4610 may be able to conduct an MPEG decoding operation (e.g., MPEG2, MPEG4, etc.) with video data output from the memory 4640. Further, the EDC 4610 may include pluralities of decoders to decode data of other types in accordance with other data formats. For instance, the EDC 4610 may include an MP3 decoder for audio data and an MPEG decoder for video data.

It can be also understood that the EDC 4610 may only include decoders. For example, previously encoded data can be received by the EDC 4610 and passed to the memory controller 4650 and/or the memory 4640.

The EDC 4610 may be able to receive data for encoding by way of the interface 4630 or receive preciously encoded data. The interface 4630 may accord to a known standard (e.g., firmware, USB, etc.). The interface 4630 may further include more one interface units. For instance, the interface 4630 may include a firmware interface, a USB interface, and so on. Data from the memory 4640 may be even output by way of the interface 4630.

The presentation components 4620 may be able to display data output from the memory and/or decoded by the EDC 4610. For instance, the presentation components 4620 may include a speaker jack for outputting audio data, a display screen for outputting video data, and so on.

The flash memory and/or the memory controller according to the present invention can be mounted on the aforementioned system or apparatus by way of various types of packages. For instance, the flash memory and/or the memory controller may be placed thereon by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, DVDs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A programming method of a flash memory device having memory cells, comprising:
   programming selected memory cells according to loaded data;

sensing states of the programmed memory cells and firstly latching the sensed states; and determining whether a program-inhibited memory cell among the selected memory cells has been programmed, with reference to the loaded data and the firstly latched states, before determining whether the selected memory cells have been properly programmed.

2. The method of claim 1, wherein a programming operation is terminated in response to the program-inhibited memory cell among the selected memory cells being programmed.

3. The method of claim 1, further comprising, in response to the program-inhibited memory cell among the selected memory cells having not been programmed:

secondarily latching the sensed states; and determining whether the selected memory cells have been properly programmed with reference to the firstly and secondarily latched states, wherein the firstly latched states are complementary to the secondarily latches states to programmed memory cells.

4. The method of claim 1, further comprising:

terminating a programming operation in status fail, without determination of whether the selected memory cells have been properly programmed, in response to the program-inhibited memory cell of the selected memory cells being programmed.

5. A flash memory device comprising:

a memory cell array having memory cells arranged in rows and columns;

a reading/writing circuit configured to provisionally reserve data to be stored in the memory cell array and program selected ones of the memory cells of the memory cell array in accordance with the provisionally reserved data; and a control logic circuit configured to control the reading/writing circuit, wherein the reading/writing circuit senses states of the programmed memory cells and firstly latches the sensed states, and the reading/writing circuit outputs first verification data indicating whether a program-inhibited memory cell among the selected memory cells has been programmed, with reference to the loaded data and the latched states, before determining whether the selected memory cells has been programmed normally.

6. The device of claim 5, wherein the control logic circuit terminates a programming operation in response to the first verification data indicating that the program-inhibited memory cell among the selected memory cells has been programmed.

7. The device of claim 6, wherein if the first verification data indicates that the program-inhibited memory cell among the selected memory cells has not been programmed, the reading/writing circuit secondarily latches the sensed states, and outputs second verification data indicating whether the selected memory cells have been normally programmed, with reference to the first and secondarily latched states, wherein the firstly latched states are complementary to the secondarily latches states to programmed memory cells.

8. The device of claim 7, wherein the first and second verification data are generated during each program loop.

9. The device of claim 5, wherein the control logic circuit terminates a programming operation in status fail, without determination of whether the selected memory cells have been properly programmed, in response to the first verification data indicating that the program-inhibited memory cell of the selected memory cells has been programmed.

10. The device of claim 5, wherein the reading/writing circuit comprises pluralities of page buffers corresponding to each of the columns, wherein each of the page buffers comprises:

a first register controlled by the control logic circuit and configured to load program data;

a second register controlled by the control logic circuit and configured to provisionally reserve the loaded data;

a discharge circuit controlled by the control logic circuit and configured to provide a discharging path to the second register in accordance with a voltage level of a corresponding bit line; and a data output circuit outputting the first verification data to a signal line in accordance with data stored in each of the first and second registers.

11. The device of claim 10, wherein the second register of each page buffer comprises:

a first latch node; and a second latch node inversely connected to the first node.

12. The device of claim 11, wherein the first latch node is grounded through the discharging path before determining whether the selected memory cells have been normally programmed and the second latch node is grounded through the discharging path in response to the selected memory cells having been properly programmed.

13. The device of claim 12, wherein the data output circuit comprises:

a first NMOS transistor having a gate connected to the second latch node, a source grounded, and a drain; and a second NMOS transistor having a source connected to the drain of the first NMOS transistor, a gate connected to the first register so as to receive the loaded data, and a drain connected to the signal line.

14. The device of claim 13, which further comprises: a third NMOS transistor connected between the second NMOS transistor and the signal line and controlled by the control logic circuit.

15. A method of programming a flash memory device having memory cells, the method comprising:

determining states of at least one of the memory cells after the programming;

determining, before verifying proper programming states, whether the at least one of the memory cells is a program-inhibited memory cell according to the determined state and a reference to loaded data.

16. The method of claim 15, wherein a latched state of the loaded data is compared to a latched state that is dependent upon a sense node of the at least one of the memory cells to determine whether the at least one of the memory cells is a program-inhibited memory cell.

17. A programming method of a flash memory device having memory cells, comprising:

programming selected memory cells according to loaded data;

firstly sensing the selected memory cells;

determining whether at least one of the selected memory cells have been properly programmed according to a result of the first sensing;

secondly sensing the selected memory cells; and determining whether a program-inhibited memory cell among the selected memory cells has been inadvertently programmed according to a result of the second sensing.

18. A programming method of a memory system including a controller and a flash memory device having memory cells, comprising:

transmitting data and addresses by the controller to the flash memory device;

programming selected memory cells according to the transmitted data by the flash memory device, the flash memory device selecting the selected memory cells among the memory cells according to the transmitted addresses;

firstly sensing the selected memory cells by the flash memory device;

determining whether at least one of the selected memory cells have been properly programmed according to a result of the first sensing by the flash memory device;

secondly sensing the selected memory cells by the flash memory device; and determining whether a program-inhibited memory cell among the selected memory cells has been inadvertently programmed according to a result of the second sensing by the flash memory device.

19. The programming method of claim 18, which further comprises:

transmitting a status fail message to the controller by the flash memory device when it is determined that the program-inhibited memory cell has been inadvertently programmed.

20. A memory system comprising:

a flash memory device;

a controller configured to control the flash memory device; and a encoding and/or decoding circuit configured to encode and/or decode data input to and/or output from the flash memory device through the controller, wherein the flash memory device includes:

a memory cell array having memory cells arranged in rows and columns; and a reading/writing circuit configured to receive data input from the encoding and/or decoding circuit through the controller and program selected memory cells among the memory cells according to the received data, wherein the reading/writing circuit firstly senses the selected memory cells, determines whether at least one of the selected memory cells have been properly programmed according to a result of the first sensing, secondly senses the selected memory cells and determines whether a program-inhibited memory cell among the selected memory cells has been inadvertently programmed according to a result of the second sensing.

21. A programming method of a flash memory device having memory cells, comprising:

programming selected memory cells according to loaded data;

sensing states of the selected memory cells and firstly latching the sensed states; and determining whether a program-inhibited memory cell among the selected memory cells has been programmed, with reference to the loaded data and the firstly latched states, and determining whether at least one of the selected memory cells have been properly programmed.

* * * * *